(12) United States Patent
Hansen

(10) Patent No.: US 8,477,472 B2
(45) Date of Patent: Jul. 2, 2013

(54) IMAGE-COMPENSATING ADDRESSABLE ELECTROSTATIC CHUCK SYSTEM

(75) Inventor: Matthew E. Hansen, Milford, CT (US)

(73) Assignee: ASML Holding N.V., Veldhoven (NL)

( * ) Notice: Subject to any disclaimer, the term of this patent is extended or adjusted under 35 U.S.C. 154(b) by 21 days.

(21) Appl. No.: 13/321,751

(22) PCT Filed: Jun. 15, 2010

(86) PCT No.: PCT/EP2010/058373
§ 371 (c)(1), (2), (4) Date: Nov. 21, 2011

(87) PCT Pub. No.: WO2011/000689
PCT Pub. Date: Jan. 6, 2011

(65) Prior Publication Data
US 2012/0087058 A1    Apr. 12, 2012

Related U.S. Application Data

(60) Provisional application No. 61/221,857, filed on Jun. 30, 2009.

(51) Int. Cl.
*H01G 7/02*    (2006.01)

(52) U.S. Cl.
USPC .......................................... 361/234; 361/233

(58) Field of Classification Search
USPC .................................. 361/233–235
See application file for complete search history.

(56) References Cited

U.S. PATENT DOCUMENTS

| | | | |
|---|---|---|---|
| 6,433,917 B1 | 8/2002 | Mei et al. | |
| 7,199,994 B1 * | 4/2007 | Levinson et al. | 361/234 |
| 2004/0037692 A1 * | 2/2004 | Landesberger et al. | 414/935 |
| 2007/0223173 A1 * | 9/2007 | Fujisawa et al. | 361/234 |
| 2009/0040681 A1 * | 2/2009 | Fujisawa et al. | 361/234 |
| 2009/0068765 A1 | 3/2009 | Murooka | |

FOREIGN PATENT DOCUMENTS

| | | |
|---|---|---|
| DE | 10 2004 010 002 A1 | 9/2005 |
| EP | 1 376 238 A2 | 1/2004 |
| JP | 04-336928 A | 11/1992 |
| WO | WO 98/57371 A1 | 12/1998 |

OTHER PUBLICATIONS

International Search Report directed to related International Patent Application No. PCT/EP2010/058373, mailed Oct. 6, 2010, from the European Patent Office; 4 pages.
International Preliminary Report on Patentability with the Written Opinion of the International Searching Authority directed to related International Patent Application No. PCT/EP2010/058373, mailed Jan. 4, 2012, from the International Bureau of WIPO; 8 pages.

* cited by examiner

*Primary Examiner* — Danny Nguyen
(74) *Attorney, Agent, or Firm* — Sterne, Kessler, Goldstein & Fox P.L.L.C

(57) ABSTRACT

Systems and methods are provided for utilizing an image-compensating addressable electrostatic chuck to correct for imaging errors of a lithographic system. An image-compensating addressable electrostatic chuck comprises a substrate, a plurality of first electrodes, a plurality of second electrodes, and a support layer. The plurality of first electrodes are disposed on the substrate and spaced evenly in a first direction. The plurality of second electrodes are disposed on the substrate and spaced evenly in a second direction, the second direction being generally orthogonal to the first direction. The support layer is disposed above the pluralities of electrodes to support an object. Positionally overlapping portions of the plurality of first and second electrodes form a matrix of electrostatic force points, such that a non-uniform electrostatic force acts on the object in proximity of a given force point upon energizing a pair of the plurality of first and second electrodes associated with the given force point.

21 Claims, 16 Drawing Sheets

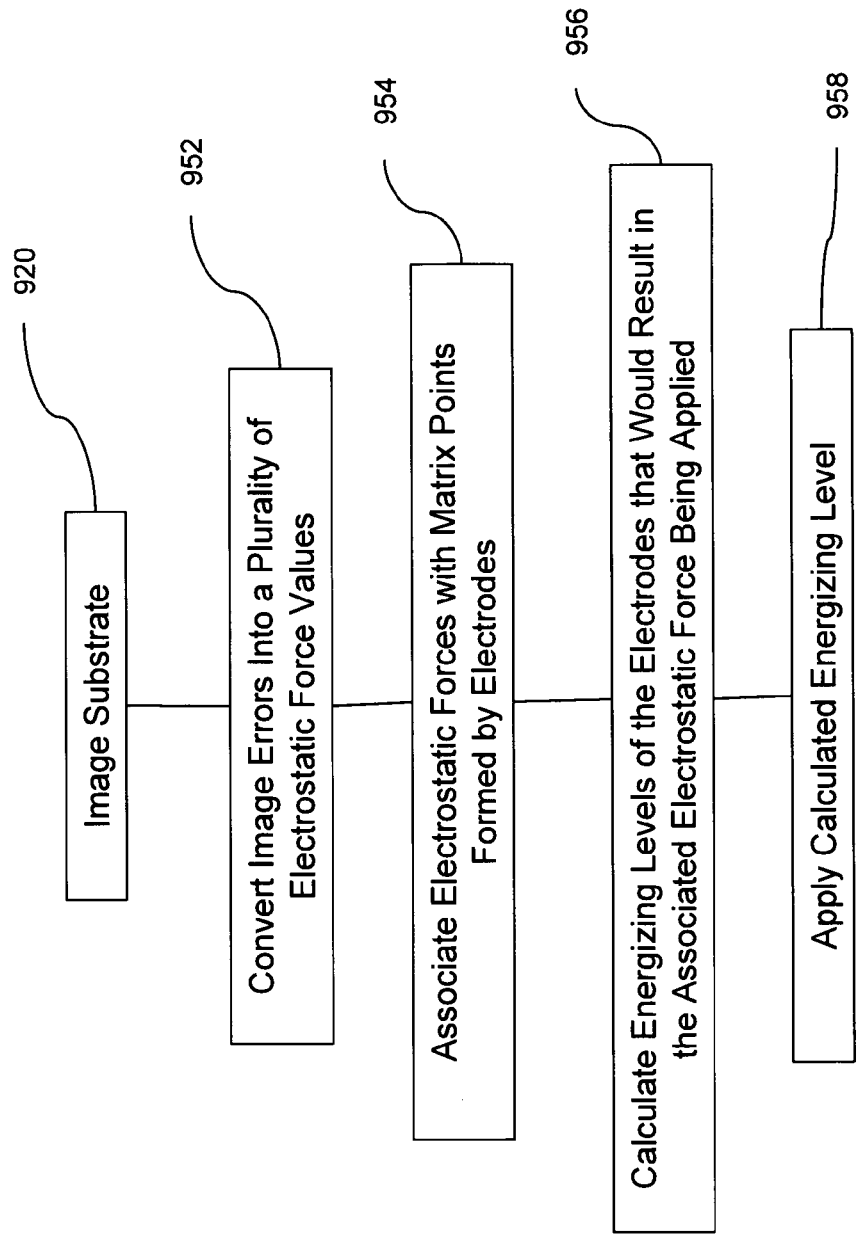

IMAGE-COMPENSATING ADDRESSABLE ELECTROSTATIC CHUCK SYSTEM

CROSS-REFERENCE TO RELATED APPLICATIONS

This application claims the benefit of U.S. provisional application 61/221,857 which was filed on 30 Jun. 2009, and which is incorporated herein in its entirety by reference.

BACKGROUND

1. Field of the Invention

The present invention generally relates to lithography, and more particularly to an electrostatic chuck system for clamping an object (e.g., a patterning device or a substrate) to a support.

2. Background Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during a lithographic process.

In order to ensure good imaging quality the patterning device and substrate must be firmly held in place by a chuck. The chuck can be manufactured with errors or irregularities that cause the chuck to be non-planar or have some other geometric deformation. Likewise, both the patterning device and/or the substrate can suffer from similar manufacturing errors that that cause them to be non-planar. With regard to the patterning device and substrate, such deformations can occur during operation of the lithographic system due to variables, such as heat absorption. The patterning device imparts to a beam of radiation a pattern, which is then imaged onto a substrate. Image quality of this projected radiation beam can be effected by image errors, such as image curvature, focus, distortion, and astigmatism.

The chuck can be formed with a series of vacuum points that hold onto the patterning device and/or substrate. However, extreme ultraviolet (EUV) lithography requires a vacuum environment. Therefore, a common practice in EUV systems is to use an electrostatic chuck to hold the patterning device and/or substrate.

The market demands that the lithographic apparatus perform the lithography process as efficiently as possible to maximize manufacturing capacity and keep costs per device low. This means keeping manufacturing defects to a minimum, which is why the effect of the non-planar deformations in the chuck, patterning device, and substrate, as well as imaging errors due to field curvature, focus, distortion, astigmatism, and scanning errors need to be minimized as much as practical.

SUMMARY

Given the foregoing, what is needed is an electrostatic chuck system and method that minimizes effects of manufacturing and operational deformations in a chuck, patterning device, and/or substrate. To meet this need, embodiments of the present invention are directed to an image-compensating addressable electrostatic chuck system and method.

According to an embodiment of the present invention, there is provided an electrostatic chuck comprising a substrate, a plurality of first electrodes, a plurality of second electrodes, and a support layer. The substrate provides backing and support for the remaining components of electrostatic chuck. The plurality of first electrodes are disposed on the substrate and spaced evenly in a first direction. The plurality of second electrodes are disposed on the substrate, positioned in an area defined by the plurality of first electrodes, and spaced evenly in a second direction, the second direction being generally orthogonal to the first direction. The support layer is disposed above the pluralities of electrodes to support an object. Positionally overlapping portions of the plurality of first electrodes and second electrodes form a matrix of electrostatic force points, such that a non-uniform electrostatic force acts on the object in proximity of a given force point upon energizing a pair of the plurality of first electrodes and second electrodes associated with the given force point.

In one example, the plurality of first and second electrodes can be comprised of either: (1) spaced apart and orthogonally placed linear electrode strips, or (2) a two dimensional array of independently electrically addressable pixels (i.e., matrix points). The two dimensional array can be electrically addressed by one compensation data set having a signature that varies in the first direction, but not the second direction, while another compensation data set has a signature that varies in the second direction, but not the first direction. Alternatively, the two dimensional array can be electrically addressed by one compensation data set having a signature that varies in the first direction, but not the second direction, while another compensation data set has a signature that varies in both the first and second directions.

In one example, in order to associate the needed electrostatic force with the correct matrix point (i.e., point of crossing of two orthogonal electrode strips or an independently electrically addressable pixel of the two dimensional array), a compensation data set is provided. The energizing level required by each electrode is based on the compensation data set. The compensation data set is generated based on the measured error to be corrected by the electrostatic chuck. A compensating data set with a signature varying in the second direction has the ability to be modified as a function of scan position at a rate consistent with the chuck stage scan rate.

In one example, the spacing of the plurality of first electrodes and second electrodes can be substantially different. Likewise, the electrostatic chuck design can have the plurality of first electrodes spaced unevenly and the plurality of second electrodes, can also be spaced unevenly, placed orthogonal to the plurality of first electrodes.

According to another embodiment of the invention, there is provided a lithographic system comprising a reticle support, a projection system, a substrate support, and an electrostatic chuck. The reticle support is configured to clamp a reticle in the path of the radiation beam so that the reticle produces a patterned beam. The projection system is configured to project the patterned beam onto a target portion of a substrate. The substrate support is configured to support the substrate during a lithographic process. The electrostatic chuck is coupled to the reticle support. The electrostatic chuck comprises a substrate, a plurality of first electrodes, a plurality of second electrodes, and a support layer. The substrate provides backing and support for the remaining components of electrostatic chuck. The plurality of first electrodes are disposed on the substrate and spaced evenly in a first direction. The plurality of second electrodes are disposed on the substrate, positioned in an area defined by the plurality of first electrodes, and spaced evenly in a second direction, the second direction being generally orthogonal to the first direction. The support layer is disposed above the pluralities of electrodes to support an object, wherein positionally overlapping portions of the plurality of first electrodes and second electrodes form a matrix of electrostatic force points, such that a non-uniform electrostatic force acts on the object in proximity of a given force point upon energizing a pair of the plurality of first electrodes and second electrodes associated with the given force point.

According to another embodiment of the invention, there is provided a method of compensating for known surface irregularities of an object utilizing an addressable electrostatic chuck comprising the following steps. Determining surface irregularities of the object. Determining a plurality of electrostatic compensation force values based on the irregularities. Correlating the plurality of electrostatic compensation force values with a plurality of matrix points formed by first and second evenly spaced sets of electrodes disposed in a substrate beneath the support layer, the first and second set of electrodes being generally orthogonally oriented to the other set. Determining an energizing level for each electrode in the first and second set of electrodes corresponding to the associated compensation force value being applied to the object at each of the plurality of matrix points. Applying the energizing level to each electrode in the first and second set of electrodes to generate an electrostatic compensation force on the object at each of the plurality of matrix points.

According to another embodiment of the invention, there is provided a method of compensating for measured surface irregularities of an object utilizing an addressable electrostatic chuck comprising the following steps. Utilizing an interferometer to determine surface irregularities of the object. Determining a plurality of electrostatic compensation force values based on the irregularities. Correlating the plurality of electrostatic compensation force values with a plurality of matrix points formed by first and second evenly spaced sets of electrodes disposed in a substrate beneath the support layer, the first and second set of electrodes being generally orthogonally oriented to the other set. Determining an energizing level for each electrode in the first and second set of electrodes corresponding to the associated compensation force value being applied to the object at each of the plurality of matrix points. Applying the energizing level to each electrode in the first and second set of electrodes to generate an electrostatic compensation force on the object at each of the plurality of matrix points. Determining, with the interferometer, the surface irregularities of the object remaining after application of the electrostatic compensation force.

In one example, the surface irregularities to be determined for compensation do not reside on the chucked object, but rather on a surface onto which the chucked object is imaged. In another example, the chucked object has minimal and pre-determined surface irregularities prior to chucking, such that surface irregularities induced by chucking will be attributed to chuck surface irregularities or spatially non-uniform clamping.

In another embodiment of the invention, there is provided a method of compensating for a plurality of image errors affecting an image quality of the imaged object utilizing an addressable electrostatic chuck comprising the following steps. Utilizing an image quality evaluation system to determine a plurality of image errors affecting an image quality of the imaged object. Determining a plurality of electrostatic compensation force values based on the plurality of image errors. Correlating the plurality of electrostatic compensation force values with a plurality of matrix points formed by first and second evenly spaced sets of electrodes disposed in a substrate beneath the support layer, the first and second set of electrodes being generally orthogonally oriented to the other set. Determining an energizing level for each electrode in the first and second set of electrodes corresponding to the associated compensation force value being applied to the object at each of the plurality of matrix points. Applying the energizing level to each electrode in the first and second set of electrodes to generate an electrostatic compensation force on the object at each of the plurality of matrix points.

In one example, the image errors can include image curvature, image focus, image distortion, and image astigmatism. In one example, after application of a first electrostatic force to correct for either object or chuck irregularities and image errors, the image quality evaluation system determines if any additional errors remain or have been introduced. If additional errors are determined, they can either be reported and/or compensated.

In one example, the plurality of electrodes can be addressed in a generally linearly fashion in a line, perpendicular to the scan direction of the chucked object. Alternatively, the plurality of electrodes can be addressed in generally an arc shape, perpendicular to the scan direction of the chucked object.

In another aspect of the invention, the electrostatic compensation force is for stage scanning inaccuracies that generate positional errors perpendicular to a stage, a chuck, an object substrate, or an image substrate.

Also, it is possible that the image quality evaluation occurs apriori to imaging in a lithographic tool. Likewise, it is possible that the image quality evaluation occurs in-situ in a lithographic tool, utilizing the imaging and image evaluation capabilities of the lithographic tool itself.

According to another embodiment of the invention, there is provided a method for improving image quality with an addressable electrostatic chuck. While the following description implies an order, it is only exemplary and the order can be rearranged without diverging from the intent of the invention. A step of the improving image quality method is compensating for surface irregularities of the electrostatic chuck. Another step is determining if the image quality after compensating for surface irregularities of the electrostatic chuck is above a predetermined acceptable threshold. If not, another step is compensating for flatness irregularities of a reticle. Another step is determining if the image quality after compensating for flatness irregularities of a reticle is above a predetermined acceptable threshold. If not, another step is compensating for system image errors. Another step is determining if the image quality after compensating for system image errors is above a predetermined acceptable threshold. If not, another step is compensating for scanned errors. Another step is determining if the image quality after compensating for scanned errors is above a predetermined acceptable threshold. A final step is compensating for irregularities of the wafer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses.

FIG. 9B illustrates a detailed flow chart of a method for converting the measured image errors into the electrostatic compensation force needed to compensate irregularities of the image in FIG. 9A.

Figure 1A:
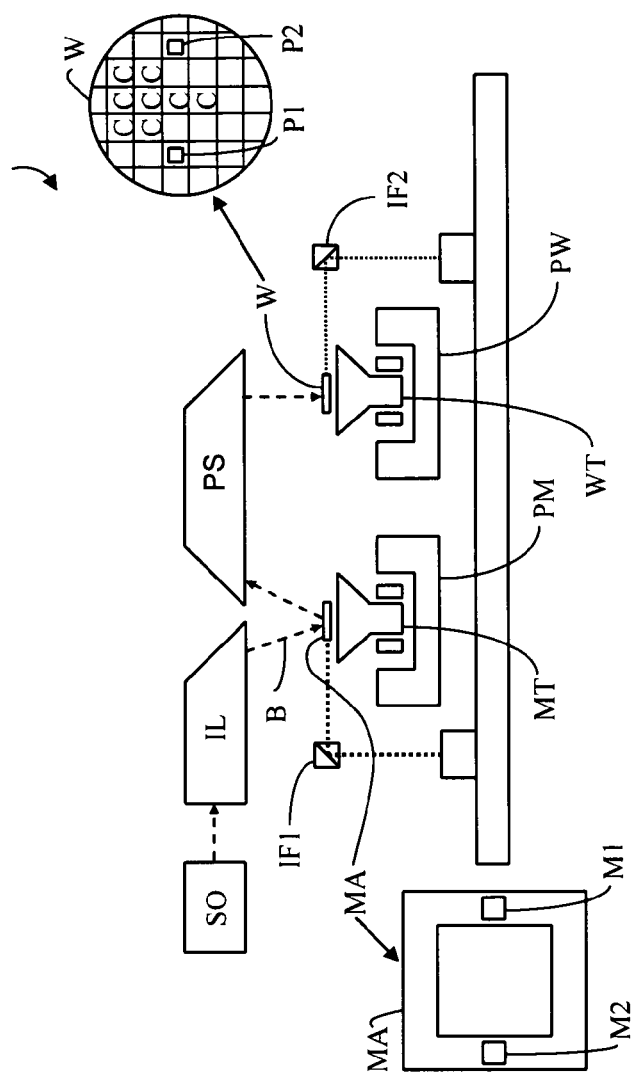

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Overview

The present invention is directed to an image-compensating addressable electrostatic chuck system. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, or acoustical devices and the like. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

Detailed below are embodiments of an image-compensating electrostatic chuck system and methods of use thereof. In one embodiment a image-compensating electrostatic chuck itself comprises a substrate with two pluralities of electrodes disposed therein. One plurality of electrodes is orthogonally positioned in relation to the other plurality of electrodes, such that a plurality of matrix points are formed by the intersection of the two pluralities of electrodes. Alternatively, the plurality of electrodes consist of a two dimensional array of independently addressable pixels. A support layer is disposed above the electrodes to support an object. A calculated energizing level is applied to the plurality of electrode such that the appropriate amount of electrostatic force is applied to the object at each matrix point.

Additionally, there are provided embodiments for using the image-compensating electrostatic chuck to improve image quality. Each method can comprise placing an object to be chucked to a support layer on the support layer, converting known or measured/imaged errors into a plurality of electrostatic compensation force values and associating those values with one of a plurality of matrix points formed by orthogonally positioned electrodes. Then calculating and applying energizing levels necessary to result in the associated compensation forces being applied to the object. At least one embodiment involves receiving surface irregularities of associated components (e.g., patterning device chuck, reticle, substrate chuck, wafer, etc.) and converting the surface irregularities to electrostatic compensation values. This embodiment does not involve any active measurements of the associated components or use of the imaging system to provide feedback as to the image quality.

Another embodiment utilizes an interferometer system to determine the surface irregularities of an object. This embodiment performs the same converting, associating, calculating, and applying methodology as described above. However, this embodiment is capable of using the interferometer to determine, after the application of the electrostatic compensation force, if any remaining surface irregularities exist. And if any remaining surface irregularities do exist, the applied electrostatic compensation force is modified to compensate the remaining irregularities.

Additionally, another embodiment utilizes an image quality evaluation system to determine a plurality of image errors affecting the image quality of the imaged object. This procedure can be performed apriori to any imaging done in a system. Likewise, the image quality evaluation occurs in-situ in a lithographic tool, utilizing the imaging and image evaluation capabilities of the lithographic tool itself. In addition to possible surface irregularities in the chucks, reticles, and substrate wafers, the image quality evaluation system can correct a plurality of image errors (e.g., image curvature, image focus, image distortion, image astigmatism, etc.). This embodiment is also capable of using the image quality evaluation system to determine, after the application of the electrostatic compensation force, if any remaining image quality errors exist. And if any remaining image quality errors do exist, modify the applied electrostatic compensation force so as to compensate the remaining errors.

In yet another embodiment, the above methods can be utilized to correct for scanning inaccuracies that generate positional errors perpendicular to an object that effect image quality. The electrodes are typically addressed in a line perpendicular to the scan direction of a chucked object. In another embodiment, the electrodes can be addressed in an arc shape, perpendicular to the scan direction of a chucked object.

Before describing such embodiments in more detail, however, it is instructive to present an example environment in which embodiments of the present invention can be implemented.

II. An Example Lithographic Environment

A. Example Reflective and Transmissive Lithographic Systems

Figure 1B:
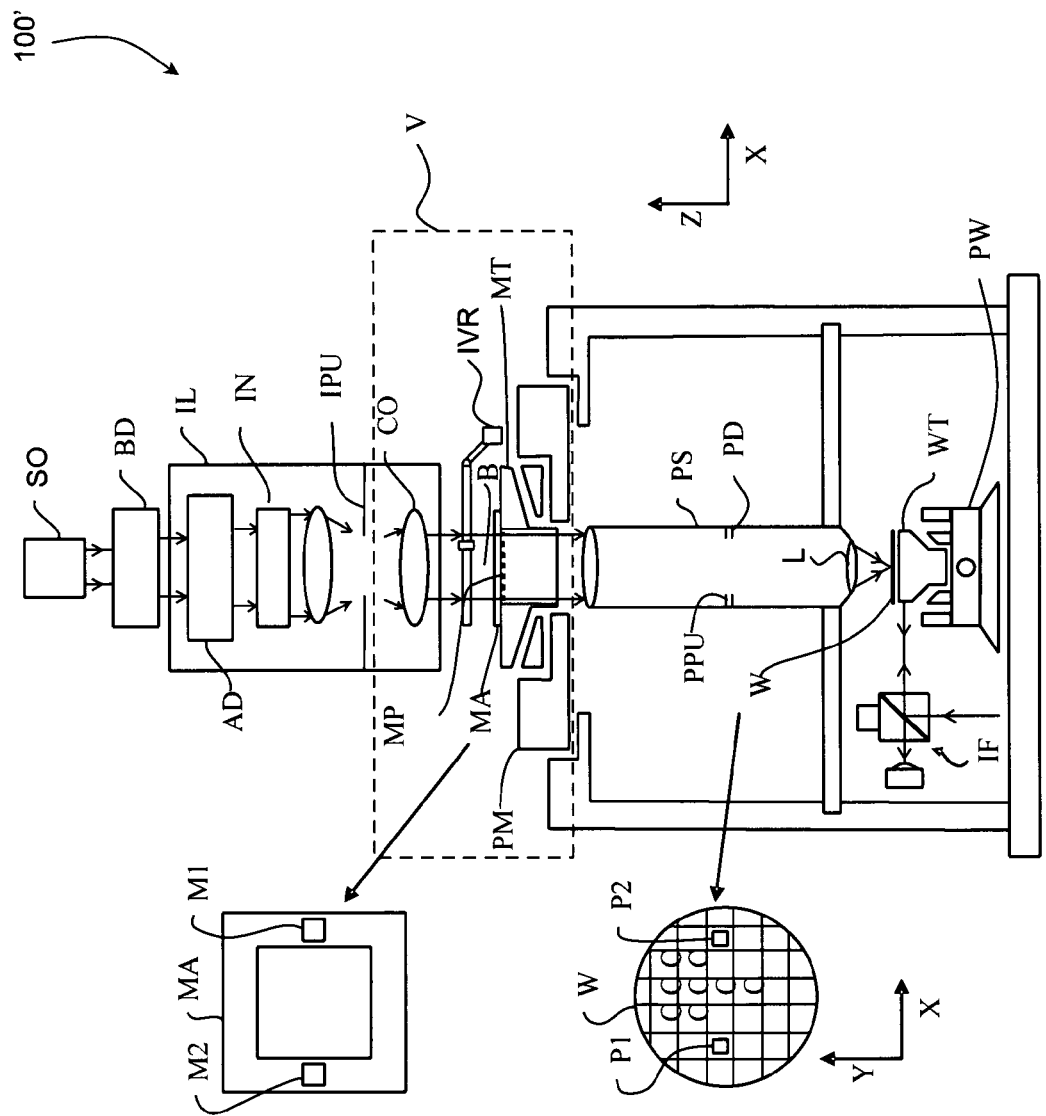

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
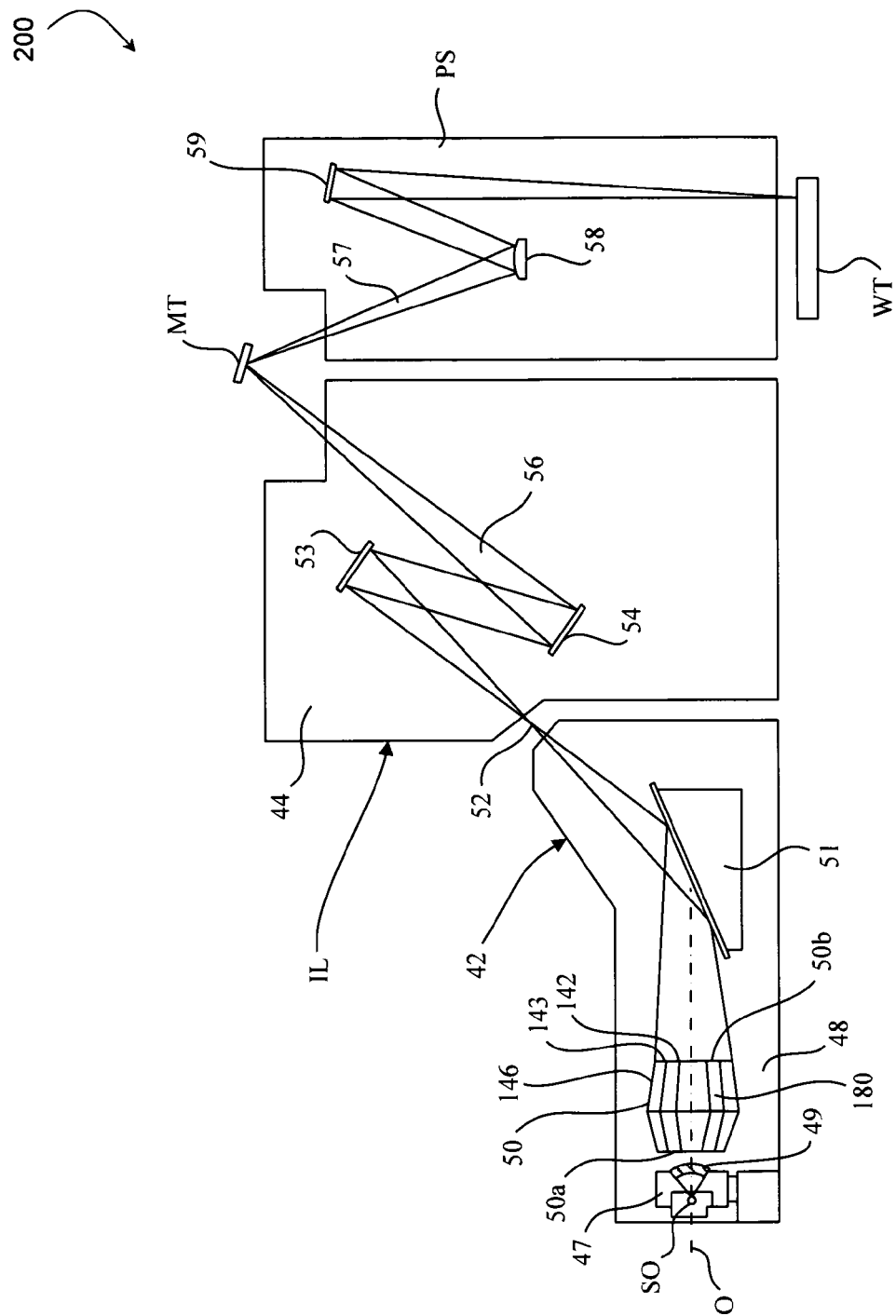
FIG. 2 depicts an example EUV lithographic apparatus.

FIG. 2 schematically depicts an exemplary EUV lithographic apparatus 200 according to an embodiment of the present invention. In FIG. 2, EUV lithographic apparatus 200 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50*a* and a downstream radiation collector side 50*b*, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 2. For example, grating spectral filter 51 may optionally be present, depending upon the type of lithographic apparatus. Further, in an embodiment, illumination optics unit 44 and projection system PS may include more mirrors than those depicted in FIG. 2. For example, projection system PS may incorporate one to four reflective elements in addition to reflective elements 58 and 59. In FIG. 2, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 2, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus 200, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 2 (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength $\lambda$ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

III. An Image-Compensating Electrostatic Clamp (or Chuck)

Figure 3:
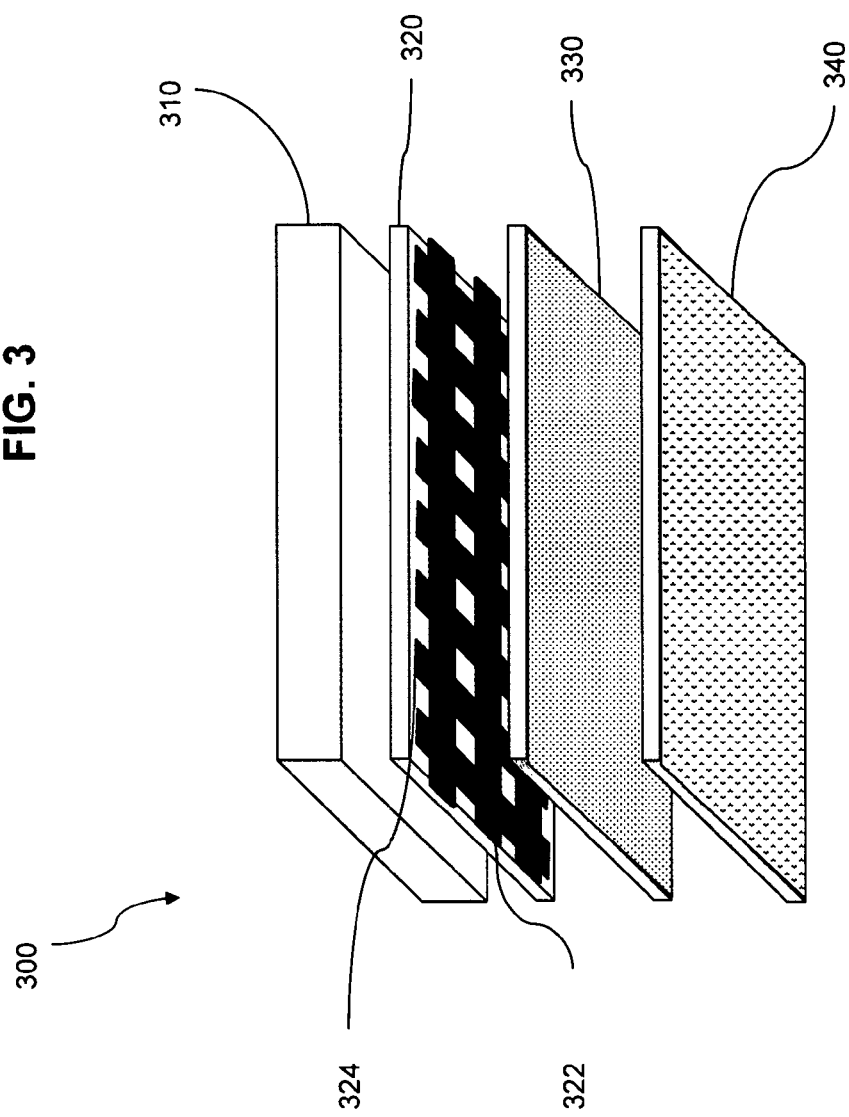
FIG. 3 depicts an expanded view of the electrostatic chuck assembly.

FIG. 3 schematically depicts an expanded electrostatic chuck assembly 300, according to an embodiment of the present invention. In FIG. 3, the electrostatic chuck assembly 300 includes a chuck substrate 310, an electrostatic clamp 320, and a pin chuck 330. Electrostatic chuck assembly 300 is configured to support (i.e., clamp) an object firmly in place during a lithographic operation. In at least one embodiment of the present invention, the object is an image patterned substrate 340 (i.e., mask or reticle).

In one example, chuck substrate 310 provides backing and support for the entire assembly and can exceed the footprint of the electrostatic clamp 320 and pin chuck 330.

In one example, electrostatic clamp 320 itself, which may be directly on top of the chuck substrate 310 or disposed therein, is comprised of at least two sets of electrodes 322 and 324, each set placed substantially orthogonal to the other set. The sets of electrodes 322, 324 are comprised of a plurality of electrode stripes, each individually electrically addressable (electrical connections not shown). The sets of electrodes are electrically isolated from each other by an isolator (e.g., each set of electrodes is disposed in dielectric material, or the sets of electrodes have a non-conductive film between them, etc.). The number of electrodes in each plurality can depend on a number of factors, such as overall footprint (i.e., size) of the desired electrostatic clamp, required density (i.e., spacing between parallel electrodes) to effectuate the needed electrostatic force, and design characteristics of the required electrostatic force field.

In one example, pin chuck 330 completes an encapsulation of the electrostatic chuck 320 and provides the physical support for any object that is being clamped to the chuck. For example, the pin chuck 330 is commonly comprised of a plurality of very small glass protrusions with flat ends.

In one example, an image patterned substrate 340 can be placed onto the pin chuck 330 and be fully supported but not have a significant amount of its surface area actually in contact with the pin chuck 330, thus reducing pin chuck 330 induced deformations of the image patterned substrate 340. In one example, pin chuck 330 is made from glass so that pin chuck 330 is not conductive and does not have any effect on the electrostatic force coupling from the electrostatic clamp 320 to the image patterned substrate 340. The pin chuck 330 does not clamp (i.e., hold in place) the image patterned substrate 340, rather the clamping is provided by the electrostatic field generated by energizing the plurality of electrodes that comprise the electrostatic clamp 320, the pin chuck 330 merely provides the physical contact support. The area above the electrostatic clamp 320 where the electrostatic field is generated can be referred to as the electrostatic clamp area of the image-compensating addressable electrostatic chuck.

Figure 4:
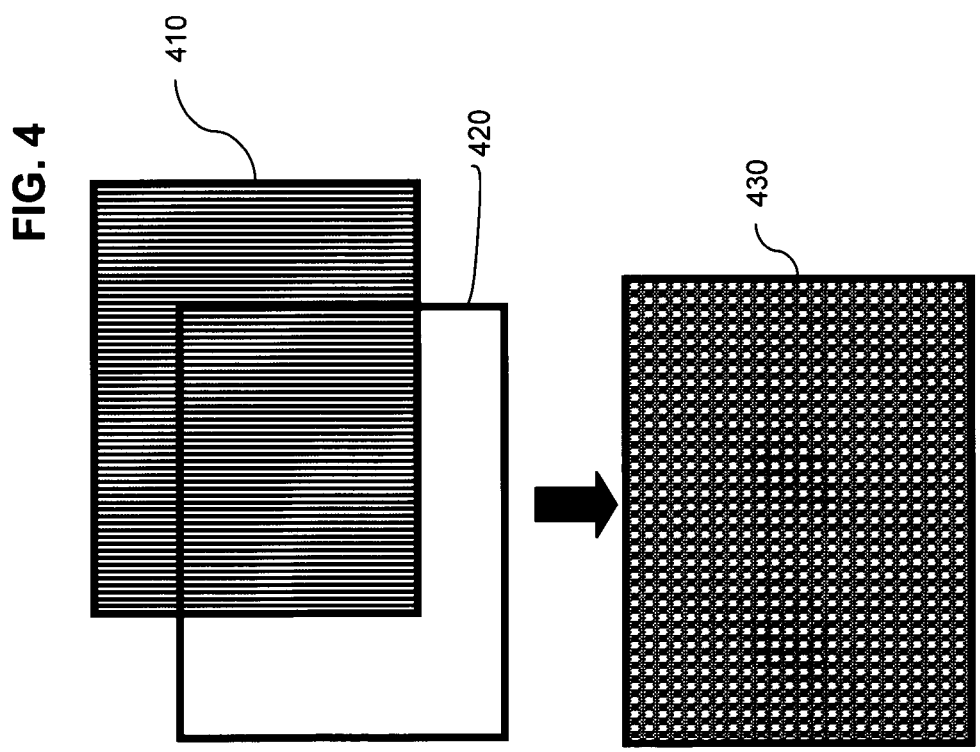
FIG. 4 shows a superimposed versus a pixel array electrode set-up.
Figure 5:
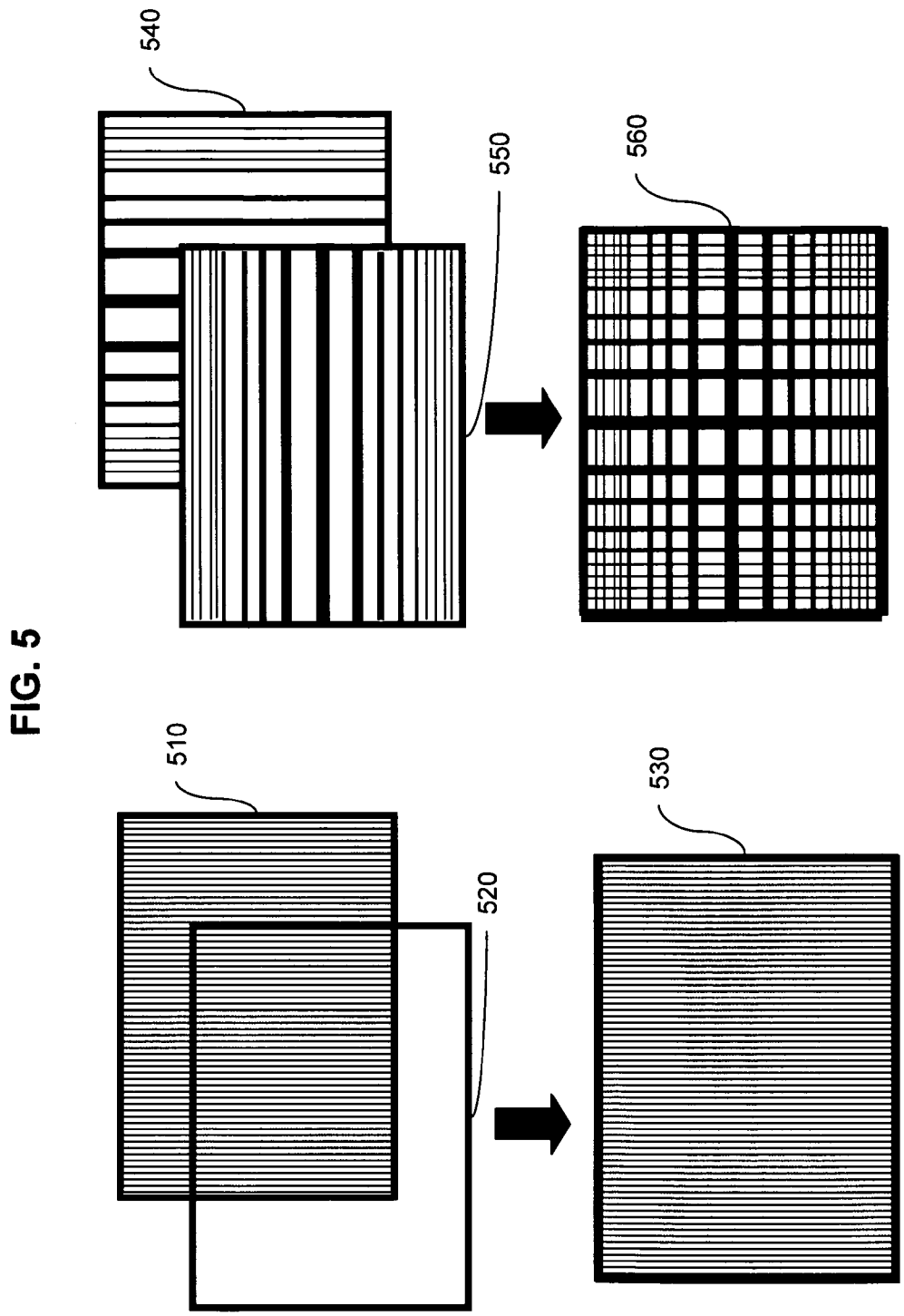
FIG. 5 shows a difference between superimposed electrode set-ups with equal/unequal and even/uneven spacing.

FIG. 4 and FIG. 5 show different embodiments of the plurality of electrodes which comprise the electrostatic clamp 320. FIG. 4 shows elements 410 and 420, which in one example are representative of the pluralities of electrodes 322 and 324 disclosed previously. For sake of description and in no other way limiting, electrode plurality 410 is comprised of a plurality of strip electrodes 322 and is delimited by a shape that is defined as the area of desired electrostatic clamping. Likewise, in no way limiting, the electrode plurality 420 is comprised of a plurality of strip electrodes 324 and is delimited by a shape that is defined as the area of desired electrostatic clamping and, in most embodiments, of the same shape and size as electrode plurality 410. As disclosed above with reference to electrode strips 322 and 324 being substantially orthogonal to each other, likewise electrode plurality 410 and electrode plurality 420 are also substantially orthogonal to each other. Each electrode in each electrode plurality is electrically separate and individually addressable (the electrical connections and controller are not shown). A person of ordinary skill in the art would be able to connect and apply energizing levels to the electrically individually addressable electrodes in order to effectuate the present invention.

In one example, by overlapping the two orthogonal electrode pluralities 410 and 420, a superimposed matrix 430 of independent electrode fields is created. It at least one embodiment, the two electrode pluralities are defined in a X direction and a Y direction, orthogonal to each other. Therefore, the superimposed matrix 430 of independent electrode fields can be referred to as overlapping X,Y electrode fields and the matrix points where the electrode overlap can be defined as matched pair X,Y points and easily addressable as such. In another embodiment, the electrode strips 322, 324 (which in quantity comprise electrode pluralities 410, 420), are replaced with individual points in a two dimensional electrode pixel array 440. The two dimensional electrode pixel array 440 is addressable by a single address instead of the needing to address two electrodes 322, 324 for each matrix point in the superimposed matrix 430. There can be a tradeoff between the two exemplary designs. The superimposed matrix 430 of independent electrode fields is easy to manufacture and electrically connect. However, applying the correct energizing level to each matrix point is non-trivial because a particular X,Y point shares the energizing level with the other points sharing the same X or same Y electrode. Therefore, careful control of the electrostatic field utilizing the superimposed matrix 430 is needed. In contrast, with the two dimensional electrode pixel array 440 the electrostatic field at each pixel is independent of the other pixels, and is controlled by applying the appropriate energizing level to the appropriate pixel without regard for the energizing level of the surrounding pixels.

FIG. 5 illustrates additional embodiments of the present invention. In one example, elements 510 and 520 are similar to 410 and 420 except the have dissimilar spacing. In FIG. 5, electrode plurality 510 has large spacing (i.e., low density), while electrode plurality 520 has relatively small spacing (i.e., high density). By overlapping the two dissimilarly spaced orthogonal electrode pluralities 510 and 520, a biased superimposed matrix 530 of independent electrode fields is created. The bias refers to the fact that the higher density electrode placement, provided by the electrode plurality 520 allows for more precise and finer electrostatic fields in the biased direction relative to the electrostatic field direction generated by the lower density electrode plurality 510.

In at least one embodiment, the object to be clamped has fairly consistent deformations. In particular, the object is often deformed (e.g., curved) along the edges of the object. The object can take a bowed shape where the center is either above or below the outer edges of the object. Accordingly, an electrostatic clamp 320, should provide more precise control of the electrostatic fields at the edges of the electrostatic clamp 320 area. The electrode plurality 540 illustrates a plurality of electrodes that are more densely placed at two opposing ends of the electrostatic clamping area. The electrode plurality 550 illustrates a plurality of electrodes that are more densely placed at two opposing ends of the electrostatic clamping area, such that the two opposing ends of electrode plurality 550 are orthogonal to the opposing ends of electrode 540. Likewise, in order to maintain a sufficient electrostatic field across the entire electrostatic clamping area, the strip electrodes in the lower density portions of each electrode plurality 540, 550 can have a proportionally increased width. By overlapping the two directional and extremity biased orthogonal electrode pluralities 540 and 550, a spatially non-linear superimposed matrix 560 of independent electrodes is created. With bias in two orthogonal directions and with higher density of electrodes placed along the edges of the electrostatic clamp 320 area, this embodiment of the electrostatic clamp 320 is capable of a spatially non-linear electrostatic field with more precise (e.g., finer) forces along the edges of the electrostatic clamp area.

Figure 6:
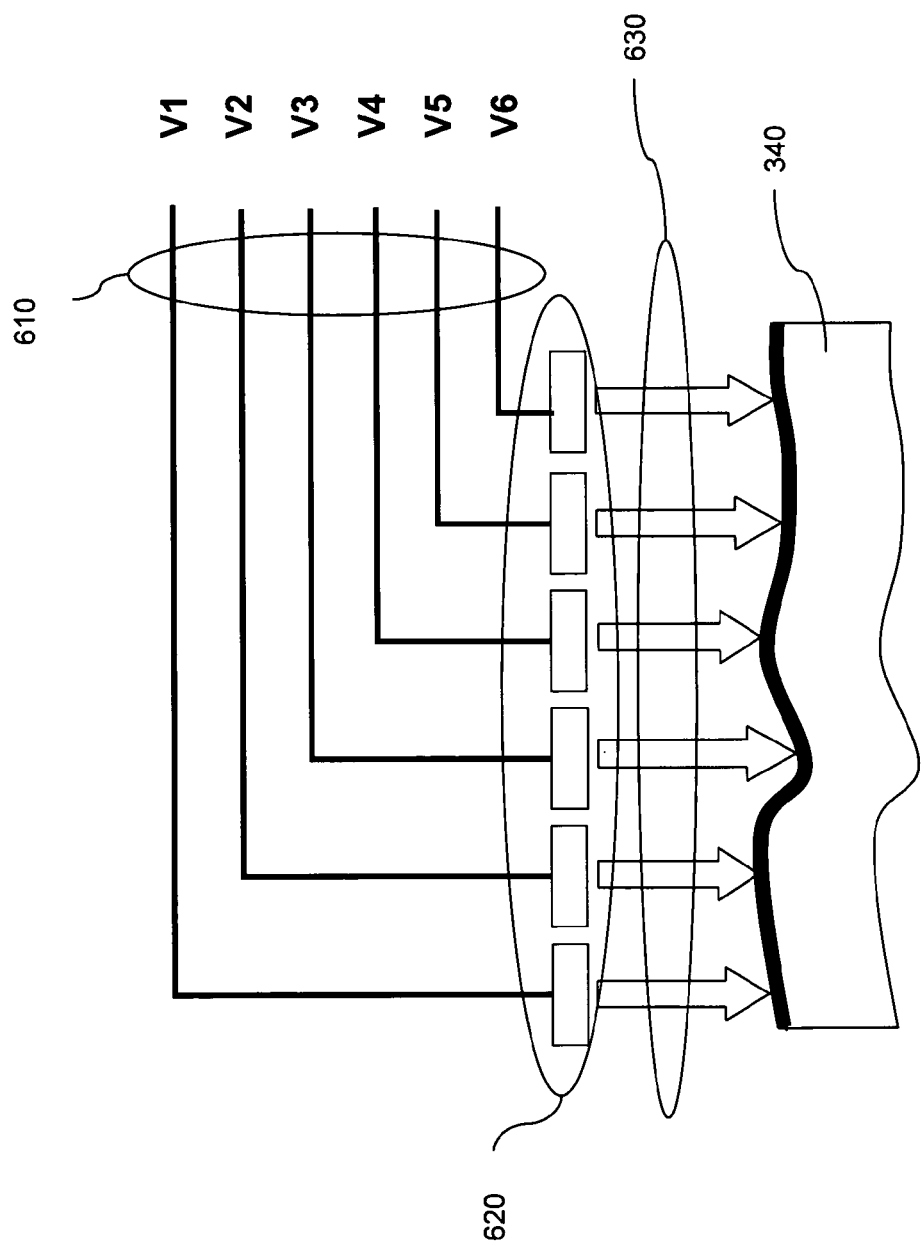
FIG. 6 depicts energizing electrode matrix points in order to apply a spatially compensating electrostatic force onto an object's irregular surface.

FIG. 6 schematically shows electrostatic clamp 320, in which each electrode is electrically individually addressable, according to an embodiment of the present invention. Element 610 is a series of six exemplary electrical connections to six illustrative strip electrodes 620 (shown here as cross sections). The electrical connections 610 are provided with an energizing level, shown in FIG. 6 as voltages V1-V6. While voltage is the most common measure of energizing level for the electrodes in the present invention, the energizing level is not limited to being defined by only voltage. The application via the electrical connections of an energizing level to the strip electrodes 620 generates an electrostatic force 630 in close proximity to each of the electrodes 620.

An object 340 may contain surface irregularities (illustrated in FIG. 6 by the curvature of the illustrative object 340) that can be corrected by the application of an electrostatic force 630. Because a plurality of energizing levels (V1-V6) can be communicated via the plurality of electrical connections 610 to the plurality of electrodes 620, a plurality of electrostatic forces 630 can be generated with relation to each of the plurality of electrodes 620. This means that one or more electrodes can generate more or less force than the surrounding electrodes in order to apply a non-uniform electrostatic force onto a non-uniform object in order to correct the non-uniformity of the object. In one example, this principle can be extrapolated to the two dimensional embodiments disclosed in the FIG. 4 and FIG. 5 above, where the electrostatic force is applied to an object in two dimensions based on the energizing level applied to the plurality of orthogonally disposed electrodes or the two dimensional pixel array. Likewise, as illustrated by FIG. 5, the design and layout of the electrode pluralities can determine the electrostatic field properties as well as the energizing level applied to the electrodes. The exemplary model of FIG. 6 shows correction of deformations or irregularities of the object 340 being clamped. However, the application of a two-dimensional matrix of electrostatic force points is not limited to merely providing correction of deformation errors.

In one example, electrostatic forces can be applied to a clamped object to correct surface irregularities of the chuck/clamp, to correct for imaging errors of the projection system, to correct for deformation/irregularity of the target substrate, and to correct for scanning errors that are perpendicular to the direction of scanning Therefore, it is important to note that the electrostatic force is not only used to correct for object deformations, but can induce object deformations to compensate the image for various other lithographic system errors and thus improve total image quality, which in turn, minimizes manufacturing defects and improves efficiency.

Figure 7A:
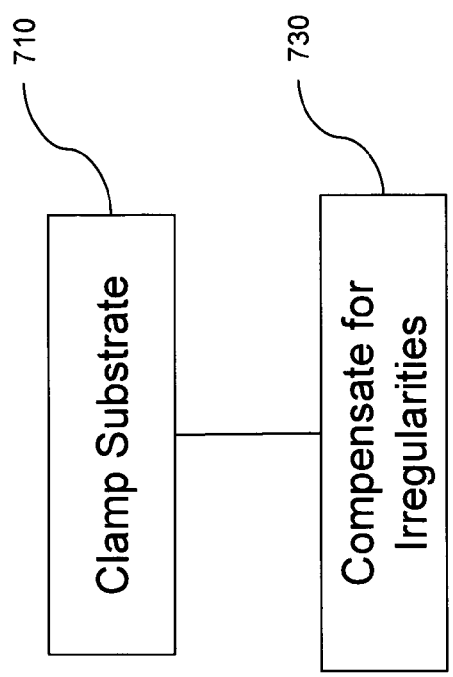
FIG. 7A illustrates a flow chart of a method for an image-compensating electrostatic chuck system.

FIG. 7A illustrates a method for using an electrostatic chuck to maximize manufacturing efficiencies by improving the quantity of successfully imaged devices, according to an embodiment of the present invention. One method of using the electrostatic chuck system contains two steps: clamping the substrate 710 and compensating for irregularities 720. Additional steps can be employed.

Figure 7B:
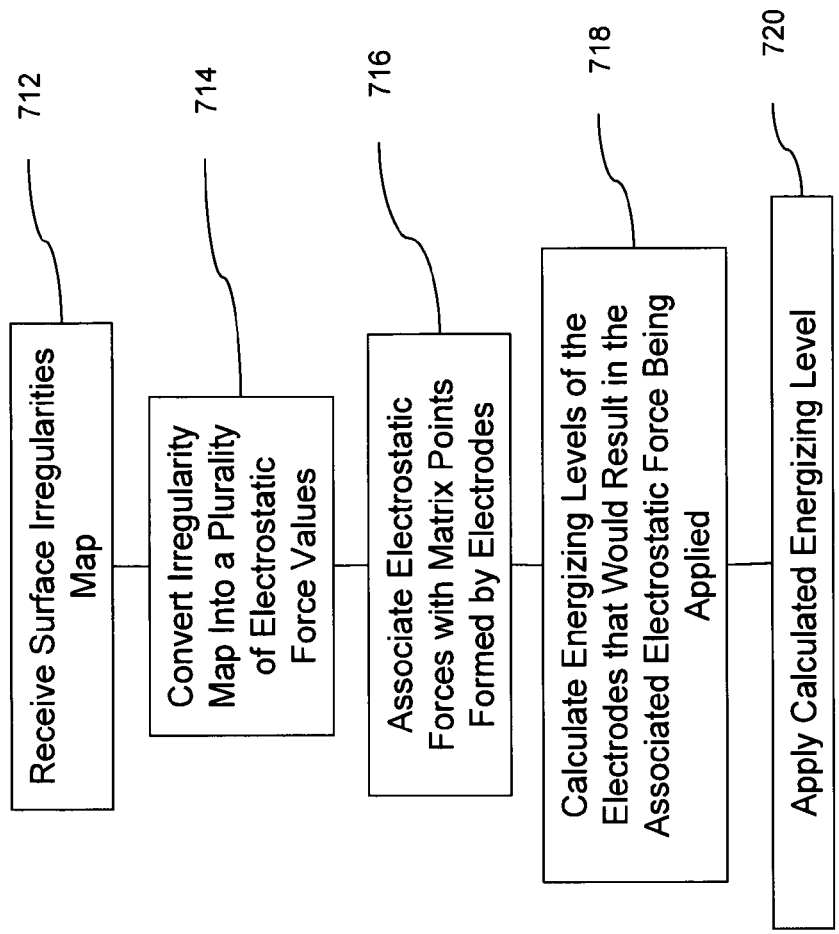
FIG. 7B illustrates a detailed flow chart of a method for converting a surface irregularity map into the electrostatic compensation force needed to compensate irregularities in FIG. 7A.

The embodiment of FIG. 7B comprises five more steps between clamping (at step 710) and compensating (at step 720). These five steps are receiving surface map irregularities 712, converting the irregularity map into a plurality of electrostatic forces 714, associating the electrostatic forces with matrix points formed by electrodes 716, determining (e.g. calculating) energizing levels of the electrodes that would result in the associated electrostatic force being applied 718, and applying the calculated energizing level 720.

In an embodiment of the present invention, the object to be held in place (i.e. "chucked") is first clamped (at step 710), via a standard uniform non-customized electrostatic field, to an image-compensating addressable electrostatic chuck 300 (as shown, for example, in FIG. 3). A surface irregularities map is received (at step 712) by a dynamic electrostatic field controller (not shown). The controller contains internal logic to convert (at step 714) the received map (from step 712) into a plurality of electrostatic force values (i.e., the amount of electrostatic force that will be needed to compensate for the surface irregularities). At step 716, the controller associates each of the electrostatic force values with either a matrix point formed be the crossing of two electrode strips or by a point on a two dimensional electrostatic pixel array. Next, at step 718, an energizing level for each matrix point or point of a two dimensional array is calculated such that the associated electrostatic force is applied to the clamped object. And finally, at step 720, the calculated energizing level is applied by the controller to the electrodes of the electrostatic chuck 300. By applying the energizing level to the electrodes, step 730 of compensating for the irregularities is accomplished. After the addressable energizing levels are applied to the electrostatic chuck matrix points or the electrostatic chuck matrix pixels, the electrostatic field is non-uniform and each of a plurality of matrix points or pixels is being held at a different energizing level. The differing energizing levels create different electrostatic forces on the object being chucked. This differing electrostatic field allows the chuck to reshape the object being held so as to correct for surface irregularities of the object.

The image-compensating addressable electrostatic chuck is not limited to correcting surface irregularities of the object being clamped. The image-compensating addressable electrostatic chuck can also correct deformations if the pin chuck 330 and/or underlying chuck substrate 310 has manufacturing defects that cause the object being clamped to be deformed. The manufacturing irregularities causing the deformation of the object to be clamped must be mapped (i.e., identified) in advance, prior to correction. Likewise, if mapped irregularities of both the object and the substrate/pin chuck exist, the controller can combine the two data sets and produce a correction that will compensate the image for both types of errors.

In another embodiment, image errors (e.g., image curvature, image focus, image distortion, astigmatism, etc.) created by the projection system are present and applying a non-uniform electrostatic force to the object compensates for the image errors. In some embodiments, the details of the image errors have been previously quantified. This data can be used by the controller to compensate for the image error, either alone or in combination with correcting the manufacturing defects of the chuck substrate/pin chuck and/or the surface irregularities of the object itself. In another embodiment, repeatable scan errors that are perpendicular to the direction of scan can be compensated for. Data regarding the scan errors can also be received by the controller and compensated for by modifying the electrostatic force applied to the object at the proper point during the scan. Correcting for the scanning errors can be done alone or in combination with compensation for the chuck substrate/pin chuck manufacturing errors, the object surface irregularities, and the image errors introduced by the projection system.

Figure 8A:
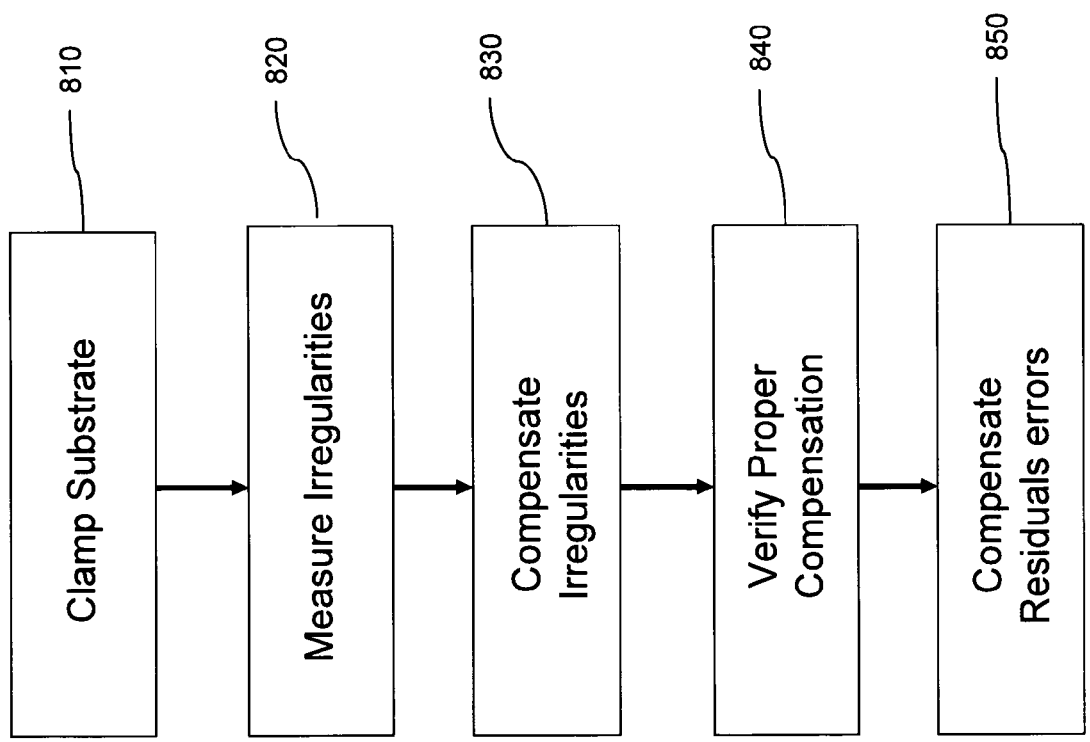
FIG. 8A illustrates a generalized flow chart of a method for an image-compensating electrostatic chuck system by actively measuring the image.

FIG. 8A illustrates another method of the present invention for using the electrostatic chuck with feedback, such that after compensation electrostatic forces are applied to the object, the image is checked for residual errors that can then be compensated for with additional electrostatic compensation. FIG. 8A comprises the following steps: the substrate or object is clamped to the chuck 810, the irregularities are measured 820, the irregularities are compensated for 830, the image is monitored to verify the proper compensation was applied 840, and if any errors remain, then these residual errors are compensated for 850. The lithographic system can measure for irregularities/errors 820 in a number of ways (e.g., the irregularities/errors can be measured using an interferometer system or they can be measured using an image quality evaluation system that takes advantage of the existing imaging system of a lithographic apparatus). To verify proper compensation (at step 840), measurements identical to the initial measurement for irregularities/errors are taken. Application of further compensation for residual errors is in addition to the non-uniform image-compensating electrostatic field already compensating the image.

Figure 8B:
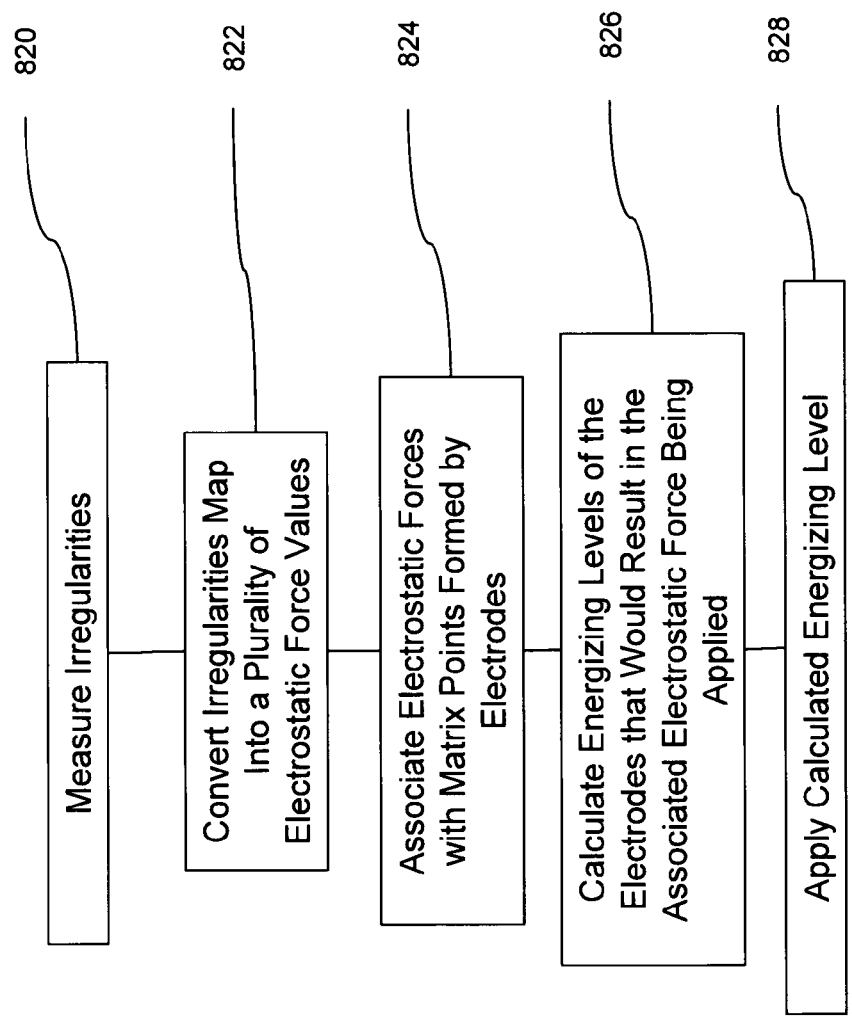
FIG. 8B illustrates a detailed flow chart of a method for converting the measured image errors into the electrostatic compensation force needed to compensate irregularities of the image in FIG. 8A.

In the embodiment shown in FIG. 8B the irregularities/errors are measured instead of receiving the irregularities/errors to be compensated (as shown in FIG. 7B). For example, as with FIGS. 7A and 7B additional steps can be employed. FIG. 8B comprises five more steps between clamping (at step 810) and compensating (at step 830). These five steps are measuring irregularities 820 (shown in FIGS. 8A and 8B), converting the irregularities into a plurality of electrostatic forces 822, associating the electrostatic forces with matrix points formed by electrodes 824, calculating energizing levels of the electrodes that would result in the associated electrostatic force being applied 826, and applying the calculated energizing level 828.

In an embodiment of the present invention, the object to be held in place (i.e., "chucked") is clamped (at step 810) via a standard uniform non-customized electrostatic field to an image-compensating addressable electrostatic chuck 300 (as shown, for example, in FIG. 3). A measurement of object irregularities is taken (at step 820) and sent to a dynamic electrostatic field controller (not shown). The controller contains internal logic to convert (at step 822) the measured irregularities (from step 820) into a plurality of electrostatic force values (i.e., the amount of electrostatic force that will be needed to compensate for the surface irregularities). At step 824, the controller associates each of the electrostatic force values with either a matrix point formed be the crossing of two electrode strips or by a point on a two dimensional electrostatic pixel array. At step 826, an energizing level for each matrix point or point of a two dimension array is calculated such that the associated electrostatic force is applied to the clamped object. At step 828, the calculated energizing level is applied by the controller to the electrodes of the electrostatic chuck 300. By applying the energizing level (at step 828) to the electrodes, step 830 of compensating for the irregularities is accomplished. Applying the addressable energizing levels to the electrostatic chuck matrix points or the electrostatic chuck matrix pixels the electrostatic field is non-uniform and each of a plurality of matrix points or pixels is being held at a different energizing level. The differing energizing levels create different electrostatic forces on to the object being chucked. This differing electrostatic field allows the chuck to reshape the object being held so as to correct for surface irregularities of the object.

In one example, steps 820 through 828 are repeated in steps 840 and 850 to compensate for any residual errors, not originally measured or created by the first compensation method. The residual compensation is cumulative to the initial compensation. In an embodiment, the compensation using measurement and feedback for residual irregularities/errors is not continuous and considered complete after a user defined number of passes.

Figure 9A:
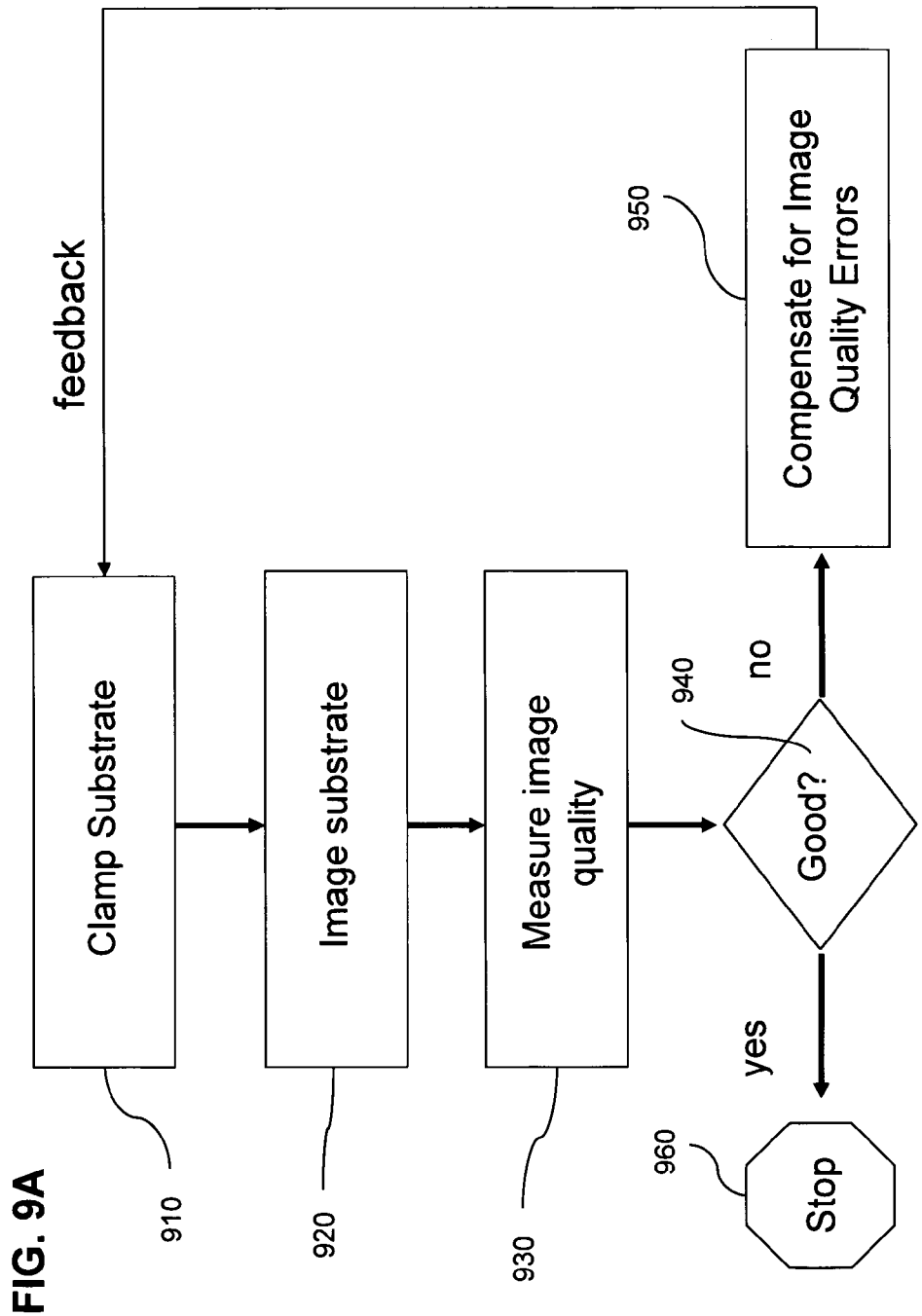
FIG. 9A is a flow chart illustrating an image error compensation method.

FIG. 9A illustrates a method for using the electrostatic chuck with an image quality feedback image-compensating addressable electrostatic chuck, according to an embodiment of the present invention. In this embodiment, the substrate/object is clamped (step 910) onto the electrostatic chuck with a uniform electrostatic field. The substrate/object is imaged (step 920) using an image quality evaluation system. In an embodiment, the image quality evaluation system can use the image components and capabilities of a lithographic system without requiring additional apparatuses. The quality of the image is measured (at step 930). A decision is made about whether the image is good (at step 940). Determining whether an image is "good" is a subjective test, at the discretion of the user. However, there are some objective elements to the test, since the end goal of the present invention is to minimize lithographic device defects and maximize throughput of the lithographic process. These objective elements include non-exclusively: image alignment, image curvature, image focus, image distortion, and astigmatism. If the image is considered good (step 940), the method stops at step 960 because the image quality is acceptable. If however the answer is negative, that the image quality is not good (step 940), then step 950 compensation for image quality is performed, which changes the uniform electrostatic field into a non-uniform image-compensating electrostatic field.

FIG. 9B is a detailed view of step 950 compensation for image quality.

In an embodiment illustrated in FIG. 9B, the object to be held in place (i.e., "chucked") is clamped (at step 910) via a standard uniform non-customized electrostatic field to an image-compensating addressable electrostatic chuck 300 (as shown, for example, in FIG. 3). A measurement of the image quality (i.e., image alignment, image curvature, image focus, image distortion, astigmatism) is made at step 920 and sent to a dynamic electrostatic field controller (not shown). The controller determines whether the image quality is good enough (step 940). If the image quality is not determined to be good, the controller contains internal logic to convert (step 952) the measured irregularities (step 920) into a plurality of electrostatic force values, (i.e., the amount of electrostatic force that will be needed to compensate for the surface irregularities). At step 954, the controller associates each of the electrostatic force values with either a matrix point formed be the crossing of two electrode strips or by a point on a two dimensional electrostatic pixel array. At step 956, an energizing level for each matrix point or point of a two dimension array is calculated such that the associated electrostatic force is applied to the clamped object. At step 958, the calculated energizing level is applied by the controller to the electrodes of the electrostatic chuck 300. By applying the energizing level (at step 958) to the electrodes, step 950 of compensating for image quality is accomplished. The differing energizing levels create different electrostatic forces on the object being chucked. This differing electrostatic field allows the chuck to reshape the object being held so as to correct for surface irregularities of the object.

Figure 10:
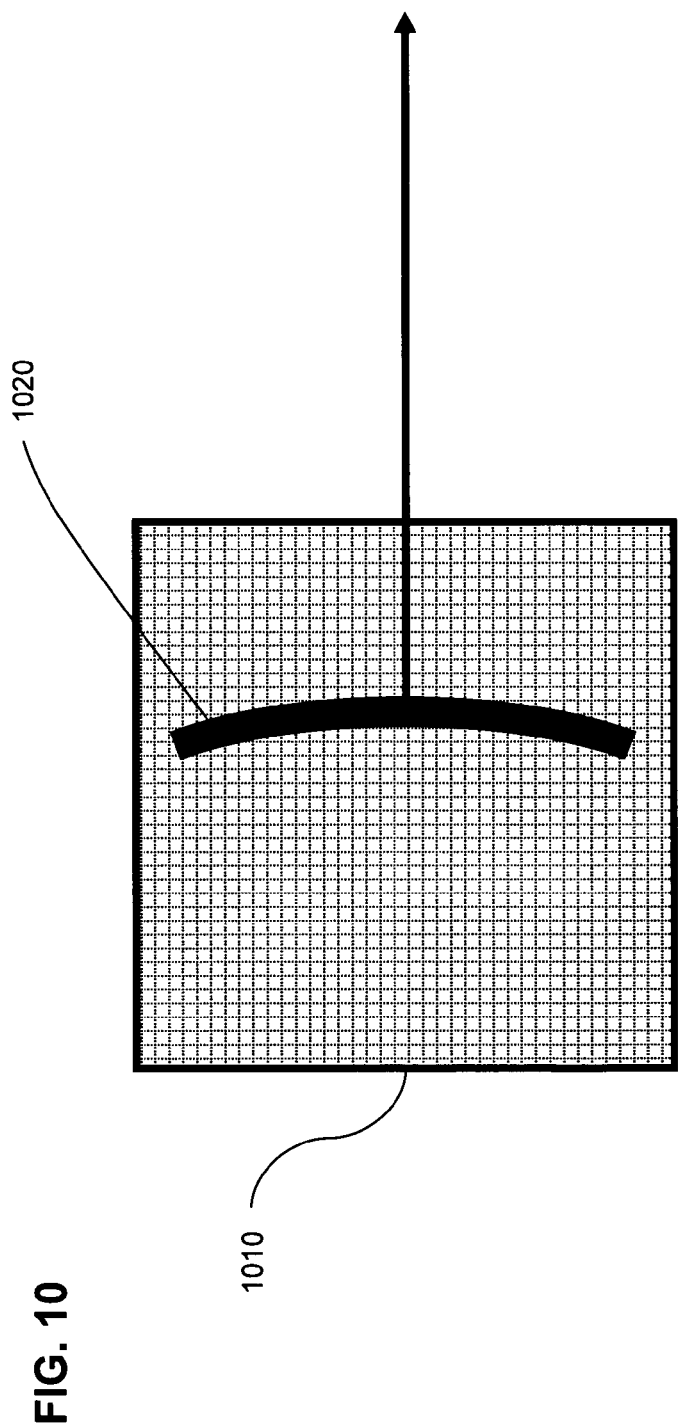
FIG. 10 shows an arc-shaped illumination of an imaging field in a stage scan direction.
Figure 11:
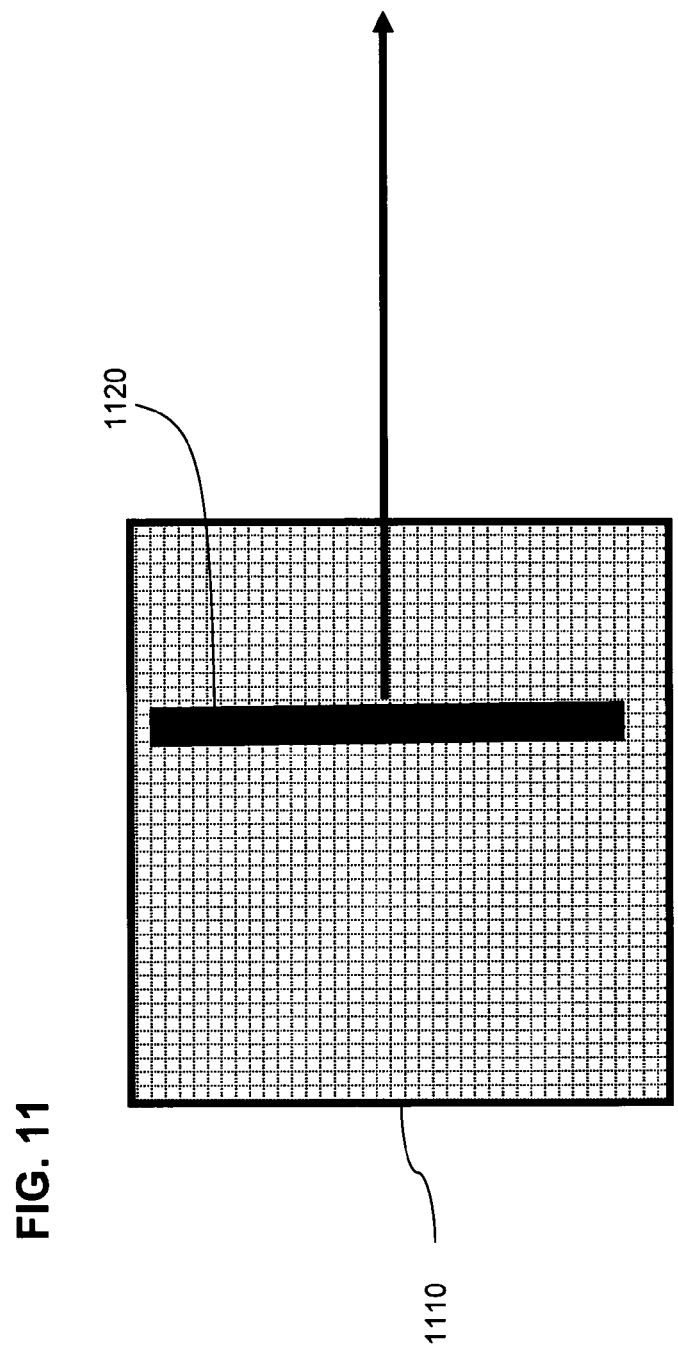
FIG. 11 shows a linear slit illumination of an imaging field in a stage scan direction.

In one example, the image-compensating addressable electrostatic clamp can also correct for scan errors that are perpendicular to the direction of scan. FIGS. 10 and 11 show two separate embodiments of methods of addressing the electrostatic compensation chuck based on the slit illumination of the stage. FIG. 10 shows the addressable electrostatic chuck matrix 1010 and an arc-shaped illumination slit 1020 in the X-direction. Scan errors in the Y-direction can be compensated for at the appropriate time based on the shape of the illumination slit, such as an arc-shaped illumination slit 1020. FIG. 11 shows the addressable electrostatic chuck matrix 1110 that compensates with a linear illumination slit 1120 in the X-direction.

Image-compensating can also be achieved with addressable electrostatic chuck clamping of the target substrate (i.e., wafer), according to an embodiment of the present invention. Residual irregularities/errors in the image quality can be compensated for by applying a non-uniform electrostatic force to the image substrate.

In another embodiment of the present invention, a method of compensating for image errors/object irregularities by measuring and compensating for a particular type of error/irregularity before measuring and compensating for another type of error/irregularity is performed. The types of image errors/object irregularities occur with different frequencies within a lithographic system and in order to improve the efficiency of the lithographic system the errors/irregularities should be addressed in similar order.

Figure 12:
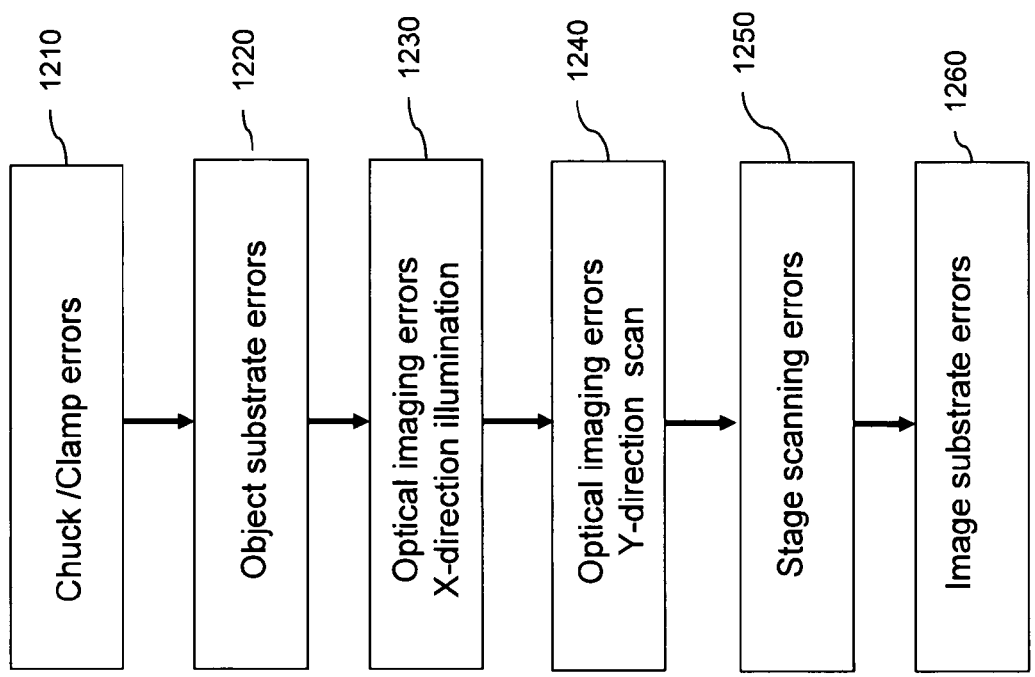
FIG. 12 is a flow chart illustrating hierarchy of correction implementation.

FIG. 12 is a hierarchal chart of the different errors/irregularities and order of implementation of compensation, according to an embodiment of the present invention. The first compensation to be implemented is for chuck/clamp errors 1210. The chuck/clamp component is a permanent piece of the lithographic apparatus and the chuck/clamp's errors/irregularities seldom change (only with temperature extremes and wear and tear). The next compensation to be implemented are the object substrate errors 1220 (i.e., mask/reticle) measured at least with each change of object substrate. The third compensation to be implemented is optical imaging errors in the X-direction illumination 1230; these errors occur slightly more often than chuck/clamp irregularities and object substrate errors due to multiple variables with the lithographic system. The next compensation to be implemented are the optical imaging errors in the Y-direction scan 1240, which similar to the X-direction illumination 1230 occur slightly more often due to multiple variables with the lithographic system. The fifth compensation to be implement is stage scanning errors 1250 which occur much more often. The scanning errors 1250 are often not deterministic and harder to measure/quantify. The stage scanning errors 1250 that are deterministic are compensated for after the other four compensations have been used to improve the image quality. And lastly, compensation for image substrate (i.e., wafer) errors 1260. The errors are present with each change of the wafer which occurs frequently. However, the compensation for errors on the wafer does not have as much effect on the overall image quality as the other types of compensation. Therefore, despite the fact that image substrate errors are the most frequently occurring, the other compensations are usually capable of properly improving the image quality.

In one example, these differing types of compensation are performed piecemeal until the image quality is satisfactory. For example, in some cases only chuck/clamp errors 1210 will need to be compensated for, but in other cases each type of error will need to be compensated in order to achieve acceptable image quality. The compensations are cumulative such that each level will further improve the overall image quality, and once the image quality has achieved an acceptable level, no further compensation is needed.

IV. Conclusion

It is to be appreciated that the Detailed Description section, and not the Summary and Abstract sections, is intended to be used to interpret the claims. The Summary and Abstract sections may set forth one or more, but not all, exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been defined for the convenience of the description. Alternate boundaries can be defined so long as the specified functions and relationships thereof are appropriately performed.

The foregoing description of the specific embodiments will so fully reveal the general nature of the invention. Others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the terminology or phraseology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An electrostatic chuck, comprising:
   a substrate:
   a plurality of first electrodes disposed on the substrate and spaced evenly in a first direction;
   a plurality of second electrodes, disposed on the substrate, positioned in an area defined by the plurality of first electrodes, and spaced evenly in a second direction, the second direction being generally orthogonal to the first direction; and
   a support layer disposed above the pluralities of electrodes to support an object,
   wherein positionally overlapping portions of the plurality of first electrodes and second electrodes form a matrix of electrostatic force points, such that a non-uniform electrostatic force acts on the object in proximity of a given force point upon energizing a pair of the plurality of first electrodes and second electrodes associated with the given force point.

2. The electrostatic chuck of claim 1, wherein the plurality of first and second electrodes comprise spaced apart orthogonal electrode patterns comprised of linear electrode strips.

3. The electrostatic chuck of claim 1, wherein an energizing level for each of the
   electrodes in the plurality of first and second electrodes is based on a compensation data set.

4. The electrostatic chuck of claim 3, wherein the compensation data set is generated from a measure of error to be corrected by the electrostatic chuck.

5. The electrostatic chuck of claim 3, wherein the compensation data set is modified as a function of scan position at a rate consistent with a chuck stage scan rate.

6. The electrostatic chuck of claim 1, wherein the plurality of first and second electrodes comprise an electrode pattern comprising a two dimensional array of independently electrically addressable pixels.

7. The electrostatic chuck of claim 6, wherein the two dimensional array is electrically addressed by one compensation data set having a signature that varies in the first direction, but not the second direction, while another compensation data set has a signature that varies in the second direction, but not the first direction.

8. The electrostatic chuck of claim 6, wherein the two dimensional array is electrically addressed by one compensation data set having a signature that varies in the first direction, but not the second direction, while another compensation data set has a signature that varies in the first and second directions.

9. The electrostatic chuck of claim 1, wherein a spacing of the plurality of first electrodes is substantially different from the spacing of the plurality of second electrodes.

10. The electrostatic chuck of claim 1, wherein:
the plurality of first electrodes are spaced unevenly in the first direction; and the plurality of second electrodes are spaced unevenly in the second direction, the second direction being generally orthogonal to the first direction.

11. The electrostatic chuck of claim 10, wherein a spacing of the plurality of first electrodes is substantially different from the spacing of the plurality of second electrodes.

12. A lithographic system, comprising:
a reticle support configured to clamp a reticle in a path of a radiation beam so that the reticle produces a patterned beam;
a projection system configured to project the patterned beam onto a target portion of a substrate;
a substrate support configured to support the substrate during a lithographic process; and
an electrostatic chuck coupled to the reticle support, the electrostatic chuck comprising:
a chuck substrate;
a plurality of first electrodes disposed on the chuck substrate and spaced evenly in a first direction;
a plurality of second electrodes, disposed on the chuck substrate, positioned in an area defined by the plurality of first electrodes, and spaced evenly in a second direction, the second direction being generally orthogonal to the first direction; and a support layer disposed above the pluralities of electrodes to
support an object,
wherein positionally overlapping portions of the plurality of first electrodes and second electrodes form a matrix of electrostatic force points, such that a non-uniform electrostatic force acts on the object in proximity of a given force point upon energizing a pair of the plurality of first electrodes and second electrodes associated with the given force point.

13. The lithographic system of claim 12, wherein the plurality of first and second electrodes comprise spaced apart orthogonal electrode fields comprised of linear electrode strips.

14. The lithographic system of claim 12, wherein the plurality of first and second electrodes comprise an electrode pattern comprising a two dimensional array of independently electrically addressable pixels.

15. A method, comprising:
determining surface irregularities of an object;
determining a plurality of electrostatic compensation force values based on the irregularities;
correlating the plurality of electrostatic compensation force values with a plurality of matrix points formed by first and second evenly spaced sets of electrodes disposed in a substrate beneath a support layer of a chuck, the first and second set of electrodes being generally orthogonally oriented with respect to the other set;
determining an energizing level for each electrode in the first and second set of electrodes corresponding to the associated compensation force value being applied to the object at each of the plurality of matrix points; and
applying the energizing level to each of the electrodes in the first and second set of electrodes to generate an electrostatic compensation force on the object at each of the plurality of matrix points.

16. A method, comprising:
utilizing an interferometer to determine surface irregularities of an object; determining a plurality of electrostatic compensation force values based on the irregularities;
correlating the plurality of electrostatic compensation force values with a plurality of matrix points formed by first and second evenly spaced sets of electrodes disposed in a substrate beneath the support layer of a chuck, the first and second set of electrodes being generally orthogonally oriented to the other set;
determining an energizing level for each electrode in the first and second set of electrodes corresponding to the associated compensation force value being applied to the object at each of the plurality of matrix points;
applying the energizing level to each electrode in the first and second set of electrodes to generate an electrostatic compensation force on the object at each of the plurality of matrix points; and
determining, with the interferometer, the surface irregularities of the object remaining after application of the electrostatic compensation force.

17. The method of claim 16, wherein the chucked object has minimal and predetermined surface irregularities prior to chucking, such that the surface irregularities induced by chucking will be attributed to chuck surface irregularities or spatially non-uniform clamping.

18. A method, comprising:
utilizing an image quality evaluation system to determine a plurality of image errors affecting an image quality of the imaged object;
determining a plurality of electrostatic compensation force values based on the plurality of image errors;
correlating the plurality of electrostatic compensation force values with a plurality of matrix points formed by first and second evenly spaced sets of electrodes disposed in a substrate beneath the support layer of a chuck, the first and second set of electrodes being generally orthogonally oriented to the other set;
determining an energizing level for each electrode in the first and second set of electrodes corresponding to the associated compensation force value being applied to the object at each of the plurality of matrix points; and
applying the energizing level to each electrode in the first and second set of electrodes to generate an electrostatic compensation force on the object at each of the plurality of matrix points.

19. The method of claim 18, wherein the plurality of image errors include at least one of image field curvature, image focus quality, image distortion, and astigmatism.

20. The method of claim 18 further comprising:
determining, with the image quality evaluation system, the image errors affecting the image quality of the imaged object remaining after application of the electrostatic compensation force.

21. A method for improving an image quality of an imaged object with an addressable electrostatic chuck, comprising:
compensating for surface irregularities of an electrostatic chuck;
determining if the image quality after compensating for the surface irregularities of the electrostatic chuck is above a predetermined acceptable threshold;
if not, compensating for flatness irregularities of a reticle;
determining if the image quality after compensating for flatness irregularities of the reticle is above the predetermined acceptable threshold;
if not, compensating for system image errors;
determining if the image quality after compensating for system image errors is above the predetermined acceptable threshold;
if not, compensating for scanned errors;
determining if the image quality after compensating for scanned errors is above the predetermined acceptable threshold; and
compensating for irregularities of a wafer.

* * * * *